US009886078B2

(12) United States Patent
Kawano

(10) Patent No.: US 9,886,078 B2
(45) Date of Patent: Feb. 6, 2018

(54) INFORMATION PROCESSING APPARATUS AND POWER-OFF CONTROL METHOD OF INFORMATION PROCESSING APPARAUS

(71) Applicant: KONICA MINOLTA, INC., Chiyoda-ku (JP)

(72) Inventor: Tatsuya Kawano, Hachioji (JP)

(73) Assignee: KONICA MINOLTA, INC., Chiyoda-Ku, Tokyo (JP)

( * ) Notice: Subject to any disclaimer, the term of this patent is extended or adjusted under 35 U.S.C. 154(b) by 313 days.

(21) Appl. No.: 14/483,439

(22) Filed: Sep. 11, 2014

(65) Prior Publication Data
US 2015/0082067 A1 Mar. 19, 2015

(30) Foreign Application Priority Data
Sep. 18, 2013 (JP) .................. 2013-192760

(51) Int. Cl.
G06F 1/32 (2006.01)
G06F 9/44 (2006.01)
(Continued)

(52) U.S. Cl.
CPC .......... G06F 1/3275 (2013.01); G06F 1/3284 (2013.01); G06F 9/442 (2013.01);
(Continued)

(58) Field of Classification Search
CPC ...... G06F 1/3275; G06F 1/3284; G06F 9/442; G06K 15/4055; G11C 5/148; Y02B 60/1225; Y02B 60/1228; Y02B 60/1267
See application file for complete search history.

(56) References Cited

U.S. PATENT DOCUMENTS 4,573,141 A * 2/1986 Simon ................ G01R 21/1338
365/189.05
4,673,872 A * 6/1987 Germer ................ G01R 22/065
235/1 D
(Continued)

FOREIGN PATENT DOCUMENTS

CN 1650271 A 8/2005
JP 2001-036978 A 2/2001
(Continued)

OTHER PUBLICATIONS

Office Action (Notice of Reasons for Refusal) dated Jul. 17, 2015, by the Japanese Patent Office in corresponding Japanese Patent Application No. 2013-192760 and an English translation of the Office Action. (8 pages).
(Continued)

Primary Examiner — Thomas Lee
Assistant Examiner — Mohammad A Rahman
(74) Attorney, Agent, or Firm — Buchanan Ingersoll & Rooney PC

(57) ABSTRACT

Provided are an information processing apparatus and a power-off control method of an information processing apparatus. An information processing apparatus includes a nonvolatile memory; a cache memory for caching data to be written into the nonvolatile memory; a power switch; a spatial change detecting section configured to detect a change in state of a space around the power switch; a notification section configured to send a user a notification; and a control section. The control section is configured to determine an action of a user likely to turn the power switch off, based on a detection signal outputted by the spatial change detecting section; operate the notification section to send a user a notification that the action is being performed, in response to recognizing the action; and write data stored in the cache memory into the nonvolatile memory after
(Continued)

operating the notification section to send the user the notification.

14 Claims, 4 Drawing Sheets

(51) Int. Cl.
 *G06K 15/00* (2006.01)
 *G11C 5/14* (2006.01)
(52) U.S. Cl.
 CPC .......... *G06K 15/4055* (2013.01); *G11C 5/148* (2013.01); *Y02B 60/1225* (2013.01); *Y02B 60/1228* (2013.01); *Y02B 60/1267* (2013.01)

(56) References Cited

U.S. PATENT DOCUMENTS

| | | | | | |
|---|---|---|---|---|---|
| 6,298,482 | B1* | 10/2001 | Seidman | ............ | H04N 5/44543 348/E5.105 |
| 6,496,949 | B1* | 12/2002 | Kanevsky | ............ | G06F 11/1456 340/3.3 |
| 8,775,103 | B1* | 7/2014 | Jayaraj | ................ | H03K 17/955 702/57 |
| 2003/0204776 | A1 | 10/2003 | Testin | | |
| 2005/0113815 | A1* | 5/2005 | Ritchie | ................. | A61B 18/20 606/15 |
| 2008/0086585 | A1* | 4/2008 | Fukuda | ................... | G06F 3/061 711/100 |
| 2009/0161162 | A1* | 6/2009 | Ishii | ................... | H04N 1/00885 358/1.16 |
| 2009/0195928 | A1* | 8/2009 | Ogawa | ................... | G06F 3/0613 360/135 |
| 2010/0299558 | A1* | 11/2010 | Tojo | ..................... | G06F 11/1441 714/14 |
| 2011/0282509 | A1* | 11/2011 | Yegin | ...................... | G06F 1/266 700/295 |
| 2012/0206269 | A1* | 8/2012 | Wickman | ............ | H05B 37/0227 340/686.6 |
| 2012/0319858 | A1* | 12/2012 | Tas | ........................ | G08B 25/12 340/686.6 |
| 2013/0275738 | A1* | 10/2013 | Hung | .................... | G06F 9/4403 713/2 |
| 2014/0347172 | A1* | 11/2014 | Wan | ........................ | G08C 17/00 340/12.22 |
| 2015/0177817 | A1* | 6/2015 | Badri | .................... | G06F 1/3268 713/320 |

FOREIGN PATENT DOCUMENTS

| | | |
|---|---|---|
| JP | 2006-192781 A | 7/2006 |
| JP | 2008-212353 A | 9/2008 |
| JP | 2009-093408 A | 4/2009 |

OTHER PUBLICATIONS

Office Action (First Notice of the Opinion on Examination) dated Jan. 25, 2017, by the State Intellectual Property Office of People's Republic of China in corresponding Chinese Patent Application No. 201410471678.8, and an English Translation of the Office Action. (23 pages).

* cited by examiner

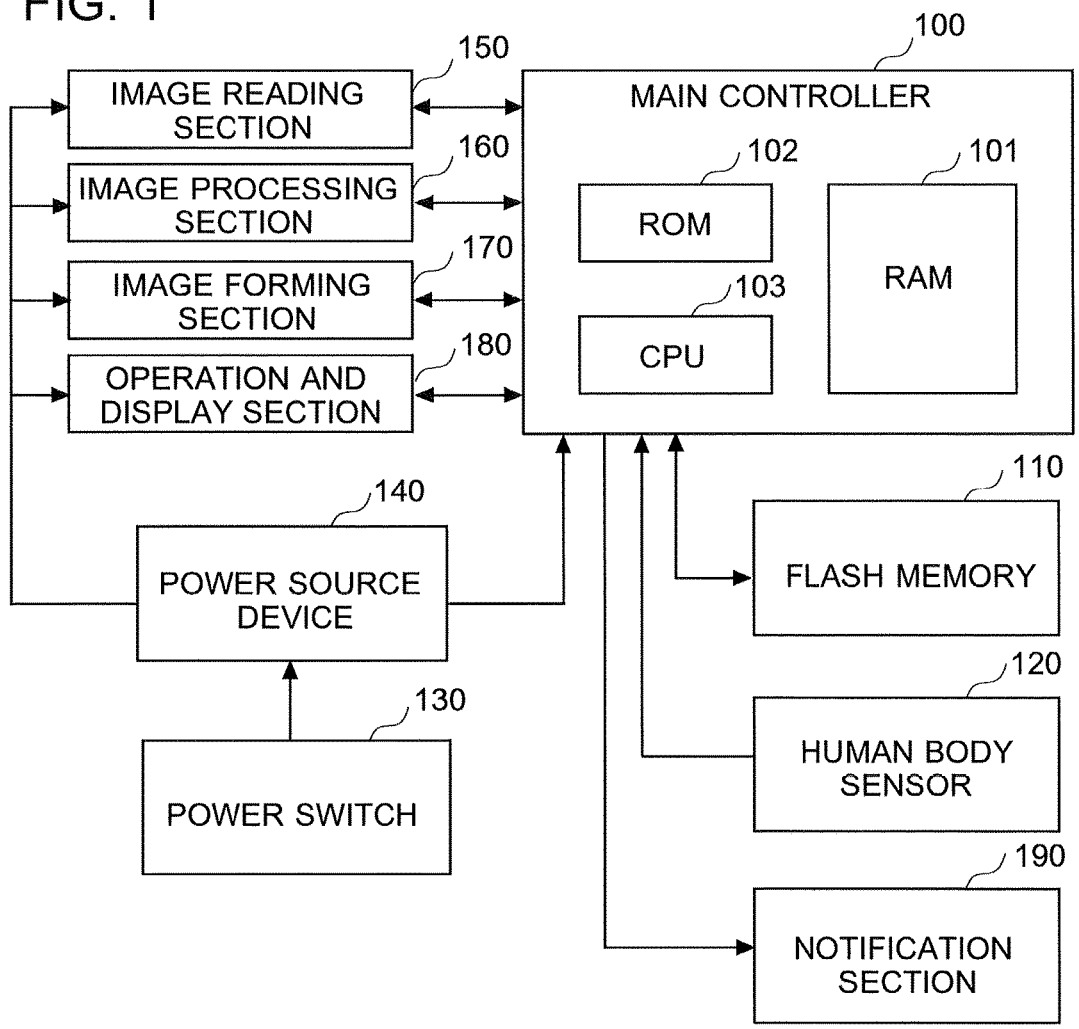
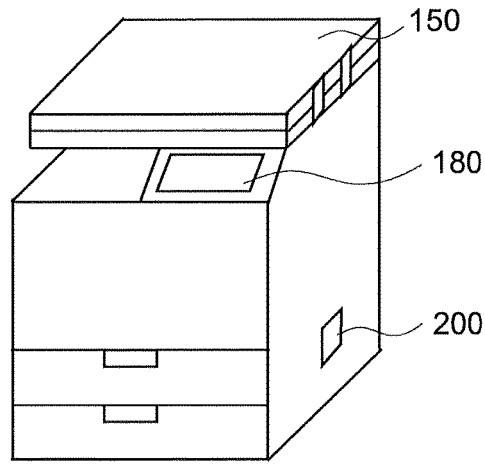

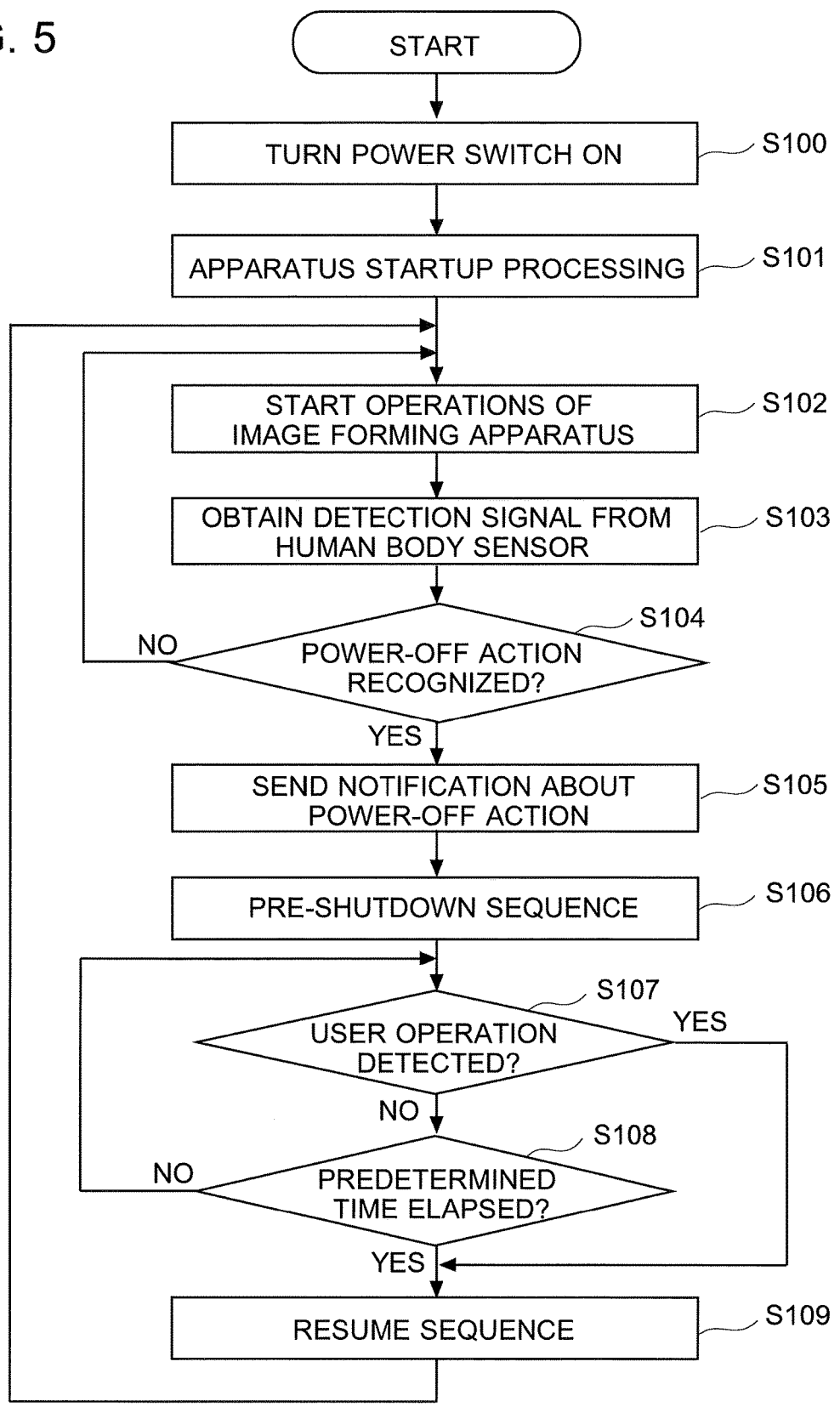

INFORMATION PROCESSING APPARATUS AND POWER-OFF CONTROL METHOD OF INFORMATION PROCESSING APPARAUS

This application is based on Japanese Patent Application No. 2013-192760 filed on Sep. 18, 2013, in the Japan Patent Office, the entire content of which is hereby incorporated by reference.

TECHNICAL FIELD

The present invention relates to an information processing apparatus and a power-off control method of the information processing apparatus. In particular, the present invention relates to an information processing apparatus in which a flash memory is mounted and a power-off control method of the information processing apparatus, both of which can control a process of writing data into the flash memory when the power of the information processing apparatus is tuned off.

BACKGROUND

Electronic apparatuses, in which a flash memory, such as a solid state drive (SSD) or an embedded multi-media card (MMC) is mounted as a main storage device, have increased in number. Meanwhile, as a semiconductor manufacturing process rule has been subdivided in recent years, the maximum number of data writing times or data retention period of a flash memory has tended to decrease, and an interest in reliability and durability of flash memories is increasing. The data retention period of a flash memory is shortened as the number of times of writing data into the flash memory increases. For this reason, in order to ensure the reliability, it is extremely important to hold down the number of times of writing data into a flash memory.

As a method of reducing the number of times of writing data into a flash memory, in general, there has been used a method of reducing the number of data writing times by preparing a cache area inside a storage device, such as a random access memory (RAM) which has high-speed data access and by buffering data of substantial size into the cache area and then writing the data into the flash memory. However, when a power switch of a device employing the method has been turned off and a power supply to the device has been stopped before the process of writing the data into the flash memory, such a situation can damage the data stored in the RAM, which can make a problem that data which is desired to be continuously used when the device is operated next time is lost.

Regarding this problem, Japanese Patent Application Laid-Open Publication (JP-A) No. 2001-036978 discloses the following state information collector. The state information collector includes an electric lead to be connected to an electric circuit of a target apparatus; a section for converting an electric potential of the electric lead into digital data; a memory section and a second memory section for accumulating and storing the digital data; a section for repeatedly sampling the digital data to accumulate the digital data in the memory section; a section for detecting a surrounding environment; and a section for accumulating and writing the accumulated data of the memory section into the second memory section when a certain object in the environment, which is detected by the section for detecting the surrounding environment, shows a specific change.

The technology in the above-described JP-A No. 2001-036978 performs processing of writing data into an external nonvolatile storage device (MO disk) when the section for detecting the surrounding environment (human body proximity sensor) detects a change (absence/presence of human) in the surrounding environment. In the technology, the processing of writing data is performed even when a user approaches close to the apparatus without any intention to turn off the power switch. For this reason, if the technology is employed to the process of writing data into a flash memory, the number of data writing times increases and life expectancy of the flash memory is shortened. The present invention seeks to solve those problems.

SUMMARY

There are disclosed illustrative information processing apparatuses and illustrative power-off control methods of an information processing apparatus.

An illustrative information processing apparatus reflecting one aspect of the present invention is an information processing apparatus comprising: a nonvolatile memory; a cache memory for caching data to be written into the nonvolatile memory; a power switch for stopping supplying power to the information processing apparatus; a spatial change detecting section configured to detect a change in state of a space around the power switch; a notification section configured to send a user a notification; and a control section. The control section is configured to determine an action of a user likely to turn the power switch off, based on a detection signal outputted by the spatial change detecting section; in response to recognizing the action, operate the notification section to send a user a notification that the action is being performed; and write data stored in the cache memory into the nonvolatile memory after operating the notification section to send the user the notification.

An illustrative power-off control method reflecting one aspect of the present invention is a power-off control method of an information processing apparatus. The information processing apparatus includes a nonvolatile memory, a cache memory for caching data to be written into the nonvolatile memory, a power switch for stopping supplying power to the information processing apparatus, a spatial change detecting section configured to detect a change in state of a space around the power switch, and a notification section configured to send a user a notification. The power-off control method comprises: determining an action of a user likely to turn the power switch off, based on a detection signal outputted by the spatial change detecting section; in response to recognizing the action, operating the notification section to send a user a notification that the action is being performed; and writing data stored in the cache memory into the nonvolatile memory after the operating the notification section to send the user the notification.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which:

FIG. 1 is a block diagram illustrating a configuration of an information processing apparatus (image forming apparatus) according to an embodiment of the invention;

FIG. 2 is a perspective view illustrating an outer configuration of the information processing apparatus (image forming apparatus) according to the embodiment of the invention;

FIG. 4A is a perspective view thereof, and FIG. 4B is a cross-sectional view taken along the line IVB-IVB of FIG. 4A;

FIG. 5 is a flow chart illustrating operations of the information processing apparatus (image forming apparatus) according to the embodiment of the invention.

DETAILED DESCRIPTION

Figure 3:
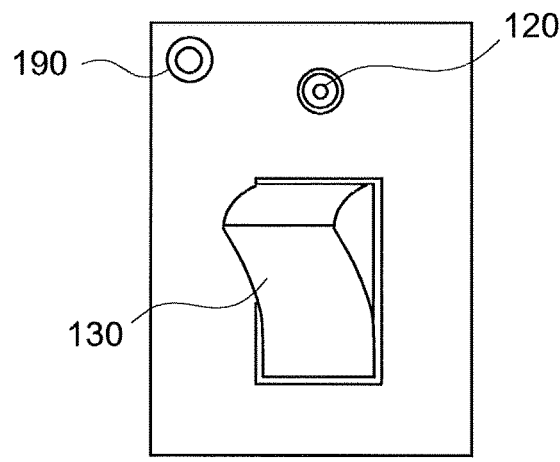
FIG. 3 is a perspective view illustrating an outer configuration of the vicinity of a power switch of the information processing apparatus (image forming apparatus) according to the embodiment of the invention.

Illustrative embodiments of information processing apparatuses and power-off control methods of an information processing apparatus will be described with reference to the drawings. It will be appreciated by those of ordinary skill in the art that the description given herein with respect to those figures is for exemplary purposes only and is not intended in any way to limit the scope of potential embodiments may be resolved by referring to the appended claims.

According to information processing apparatuses and power-off control methods of an information processing apparatus as embodiments of the present invention, it is possible to restrict the increase of the number of times of writing data into a flash memory, and to avoid in advance the loss of the data stored in the cache area due to turning off the power source.

This is because, an information processing apparatus provided with a nonvolatile memory and a cache memory, further includes a spatial change detecting section (human body sensor), a notification section and a control section. The spatial change detecting section (human body sensor) is arranged in the vicinity of a power switch, for detecting a change in state of a space around the power switch. The notification section is provided for sending a notification to a user by light or by sound. The control section is configured to perform the following control processing: to determine an action of a user likely to turn the power switch off (a user's action suggesting that the user will turn the power switch off), based on a detection signal outputted by the spatial change detecting section; in response to recognizing the action, operate the notification section to send a user a notification that the action is being performed, before the power switch is actually turned off; and write data stored in the cache memory into the nonvolatile memory after operating the notification section to send the user the notification.

A flash memory is generally made of metal oxide semiconductor (MOS) transistors (cells) in each of which a gate electrode has a two-layered structure. Examples of the flash memory include a NOR type which can read/write, remove, and rewrite data in units of one byte (that is, a source line and a bit line are connected to each cell), and a NAND type which can read/write, remove, and rewrite data in units of plural bytes (that is, plural cells are connected between the source line and the bit line in series). In all cases, by applying a high electric field to between a floating gate and a silicon substrate, electrons tunnel through a gate insulating film and are injected into the floating gate, which changes the gate voltage (threshold voltage) based on which a MOS transistor is turned from an OFF state to an ON state. By using this phenomenon, a flash memory stores information.

For this reason, if the number of times of writing data into a flash memory increases, the gate insulating film deteriorates due to tunneling of the electrons, the electrons injected into the floating gates easily escape to the silicon substrate, and the data retention period is shortened. Particularly, in a NAND type flash memory, data are written in block units even in a case of writing data with respect to a part of cells in a block, which increases the number of writing times substantially, progresses the deterioration of the gate insulating film, and shortens the data retention period. Furthermore, as a semiconductor manufacturing process rule has been subdivided in recent years, the maximum number of data writing times or the data retention period of a flash memory has tended to be further reduced.

Based on the background, it is considered that, in controlling an apparatus in which a flash memory is mounted, it is important to minimize the number of times of writing data into a flash memory. In order to reduce the number of data writing times, in general, a cache control such that data are buffered into a cache area inside a RAM and then the data are written into the flash memory is performed. However, regarding such the cache control, when the power switch has been turned off and the power supply to the device has been stopped before data are written into the flash memory, the data stored inside the RAM is damaged, which causes a problem that the data which is desired to be maintained is lost.

In view of the problem, there has been proposed a technique to arrange a surrounding environment detecting section (human body proximity sensor) in the apparatus, and to write out data according to a change of the surrounding environment. However, in the technique, the data writing-out process is performed at the approach of a user to the apparatus even if the user has no intention to turn off the power switch, which increases the number of times of writing data into the flash memory and shortens life expectancy of the flash memory.

Therefore, it is necessary to precisely determine a user's action of turning the power switch off and to control the process of writing data into a flash memory. In addition, since there is a case where a user turns off the power switch by mistake, it is necessary to prepare a countermeasure to prevent in advance a user's misoperation about the power switch.

Here, an embodiment of the invention provides the following information processing apparatus equipped with a nonvolatile memory, such as a flash memory; and a cache memory, such as a RAM. The information processing apparatus includes a spatial change detecting section (human body sensor or the like) arranged in the vicinity of a power switch and configured to detect a change in state of a space around the power switch. The information processing apparatus further includes a control section configured to determine an action of a user likely to turn the power switch off (a user's action suggesting that the user will turn the power switch off with high probability), based on a detection signal outputted by the spatial change detecting section; and in response to recognizing the action, write data stored in the cache memory into the flash memory before the power is actually turned off. With such a structure, it is possible to prevent in advance the loss of the data stored in the cache memory, while reducing the number of times of writing data into the flash memory.

Further, the information processing apparatus further includes a notification section configured to send a notification to a user by light and/or sound, and the control section is configured to, in response to recognizing an action of a user likely to turn the power switch off, based on the detection signal outputted by the spatial change detecting section, operate the notification section to send a user a notification that the action suggesting that a user will turn the power switch off is being performed. Alternatively, the power switch may be arranged in a concave part of a case of the image processing apparatus. Such the notification and the arrangement of the power switch prevent a user's misoperation about the power switch before it happens, which results in a decrease of unnecessary data writing into the flash memory.

EXAMPLE

Figure 4A:
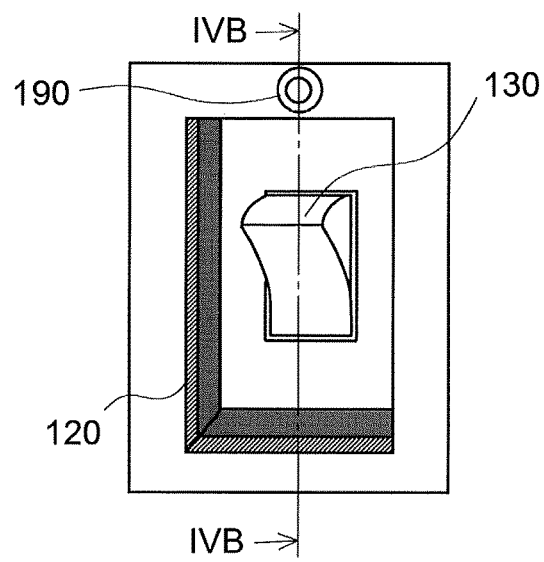
FIGS. 4A and 4B are views illustrating another example of the outer configuration of the vicinity of the power switch of the information processing apparatus (image forming apparatus) according to the embodiment of the invention, where
Figure 4B:
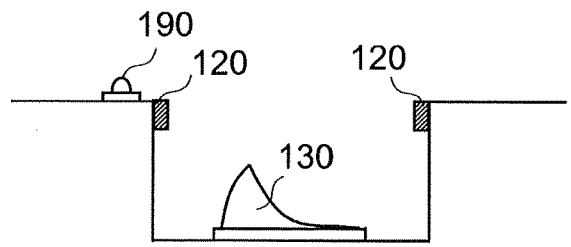
Figure 6:
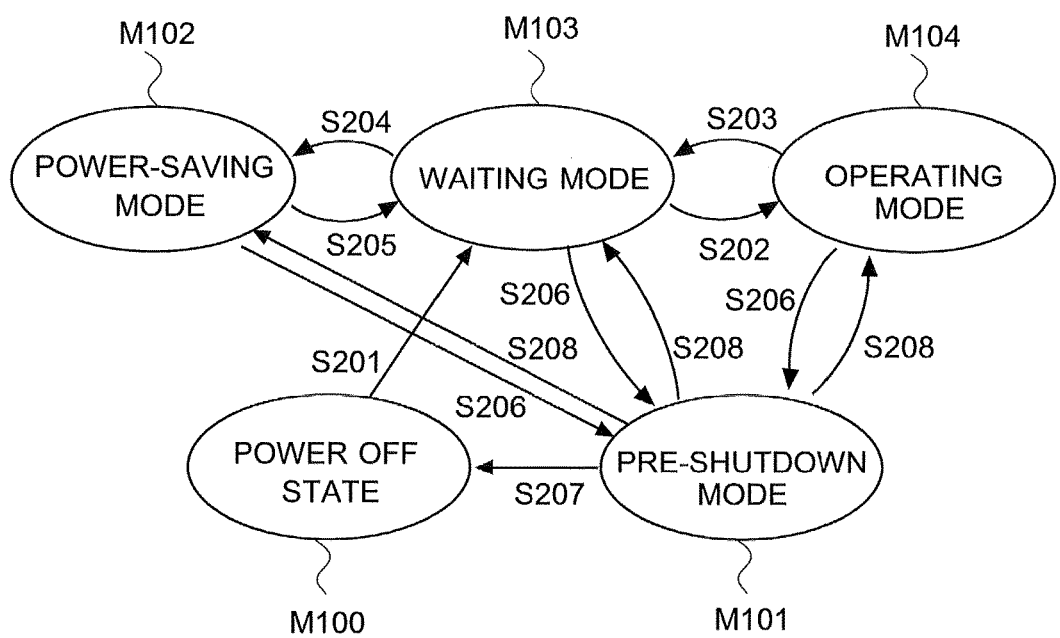
FIG. 6 is a view illustrating transition relations of working modes of the information processing apparatus (image forming apparatus) according to the embodiment of the invention.

In order to describe the embodiment of the present invention in more details, descriptions will be given to an illustrative information processing apparatus and a power-off control method of the information processing apparatus according to the present example with reference to FIGS. 1 to 6. FIG. 1 is a block diagram illustrating a configuration of the information processing apparatus according to the present example. FIG. 2 is a perspective view illustrating an outer configuration of the information processing apparatus. FIG. 3 is a perspective view illustrating an outer configuration of the vicinity of the power switch of the information processing apparatus. FIGS. 4A and 4B are a perspective view and a cross-sectional view taken along the line IVB-IVB of FIG. 4A, for illustrating another example of the outer configuration of the vicinity of the power switch. FIG. 5 is a flowchart illustrating operations of the information processing apparatus of the present example. FIG. 6 is a view illustrating transition relations of working modes of the information processing apparatus.

The information processing apparatus of the example can be, for example, an image forming apparatus, such as a multi-function peripheral (MFP). As illustrated in FIG. 1, the image forming apparatus is composed of components including a main controller 100, a flash memory 110, a human body sensor 120, a power switch 130, a power source device 140, an image reading section 150, an image processing section 160, an image forming section 170, an operation and display section 180 and a notification section 190.

The main controller (control section) 100 is composed of a RAM 101, a read only memory (ROM) 102, a central processing unit (CPU) 103, and the like. The main controller (control section) 100 is configured to receive a user's action through the operation and display section 180, and conduct a predetermined control with respect to each device connected thereto. In addition, the main controller 100 is configured to store information representing a use status of the apparatus, such as information about the total number of print sheets and information about a toner consumption amount, in the flash memory 110, and maintain the information so as to be continuously used after the next startup of the apparatus.

At that time, the main controller (control section) 100 does not write data into the flash memory every time the information to be maintained is updated, but allocates in RAM 101 a cache area to be used for a data access to the flash memory, buffers data of substantial size into the cache area data, and then writes the data into the flash memory 110. Thereby, the main controller 100 conducts a control with reducing the number of times of writing data.

The main controller (control section) 100 is further configured to receive a detection signal representing a change in state of the space in the vicinity of the power switch 130 from the human body sensor 120, and determine an action of a user likely to turn the power switch 130 off (referred to as a power-off action), based on the detection signal. The main controller (control section) 100 is further configured to, in response to recognizing the power-off action, control the notification section 190 to send a user who is present in the vicinity a notification that an action suggesting that a certain user will turn the power switch off is being performed, for example by lighting or flushing of light, or sounding an alarm, to call attention of the user. The main controller (control section) 100 is further configured to, immediately thereafter, or after elapse of a predetermined time period, write the data stored in the cache area inside the RAM 101 into the flash memory 110. In the present example, the power-off action is not an action that a user actually moves the power switch 130 to an OFF side (an action to turn the power off), but an action that a user approaches the power switch 130 for turning the power switch 130 off. It is not necessary to actually move the power switch 130 to the OFF side for the power-off action.

The main controller 100 is further configured to, after writing the data into the flash memory 110, prevent the flash memory 110 from being accessed, so as to avoid the data written into the flash memory 110 and the flash memory 110 itself from being damaged even after the power switch 130 is actually turned off. The main controller 100 is further configured to, after writing the data into the flash memory 110, detect a user's operation or monitor the time progress, and under the condition that a user performs an operation or a predetermined time period has been elapsed, control the image forming apparatus to return to the previous working mode in which the image forming apparatus worked just before the power-off action was recognized.

The flash memory 110 is a NOR type or a NAND type nonvolatile memory in which data can be read/written, removed, and rewritten. The flash memory 110 maintains information, such as the above-described total number of print sheets or the toner consumption amount even after the power of the image forming apparatus is turned off.

The human body sensor (spatial change detecting section) 120 can be an infrared sensor, an ultrasonic sensor, or a small-sized camera. The human body sensor 120 is configured to detect a change in state of the space in the vicinity of the power switch 130 (approach of a human body) by receiving infrared rays radiated from a human body surface or ultrasonic waves reflected onto the human body surface, or by recognizing a captured image, and to output a detection signal to the main controller 100.

The power switch 130 is a physical switch provided at a certain location on the case of the image forming apparatus. The power switch 130 receives a user's action of turning the power ON/OFF (an action of actually moving the power switch 130 to an ON side or an OFF side), and manages start/stop of supplying power to the power source device 140.

The power source device 140, when a user's action of turning the power on with respect to the power switch 130 has been performed, converts a commercial power source into a power source which is necessary for operating each component of the image forming apparatus and supplies the converted power to each component.

The image reading section 150 is configured to optically read image data from a document mounted on a document platen, and is composed of a light source which scans the document, an image sensor, such as a charge coupled devices (CCD) which converts the light reflected onto the document into an electric signal, and an A/D converter which conducts A/D conversion on the electric signal.

The image processing section 160 is configured to perform an image processing, such as an edge enhancement processing, a smoothing processing, or a color conversion processing, with respect to the image data of the document read by the image reading section 150. The image processing section 160 is configured to, if necessary, when printing data described in a page description language (PDL), which is represented by a PostScript or a printer control language (PCL), is obtained from another apparatus, generate the image data for every page by rasterizing each page included in the printing data, and perform the above-described image processing with respect to the generated image data.

The image forming section 170 is configured to, based on the image data on which the image processing section 160 has performed the image processing, perform print processing onto paper sheets. Specifically, in a case of an electrophotographic method, the image forming section 170 forms an electrostatic latent image by irradiating a photoreceptor drum charged by a charging device with light which corresponds to the image from an exposure apparatus, attaches and develops the charged toner by a developing apparatus, primarily transfers a toner image thereof to a transfer belt, secondarily transfers the toner image from the transfer belt to the paper sheet, and further performs a processing that fixes the toner image on the paper sheet by a fixing apparatus.

The operation and display section 180 can be a touch panel or a hard key, where a touch panel is prepared by arranging an operation section, such as a touch sensor made of a lattice-shaped transparent electrode, on a display section, such as a liquid crystal display (LCD). The operation and display section 180 is configured to provide an operation screen of the image forming apparatus to the user, receive a user's operation performed on the operation screen, and output a signal corresponding to the operation to the main controller 100.

The notification section 190 can be a light-emitting unit including a light emitting diode (LED) disposed at an arbitrary position (for example, in the vicinity of the power switch 130 or the operation and display section 180) on the image forming apparatus; or a sound generation unit, such as a speaker. The notification section 190 is configured to, when the main controller 100 recognizes a power-off action based on the detection signal outputted from the human body sensor 120, make the light-emitting unit light or flash (blink) or output an alert sound from the sound generation unit, according to a command of the main controller 100.

In the present example, the information processing apparatus is assumed to be an image forming apparatus, such as an MFP, including the image reading section 150, the image processing section 160 and the image forming section 170. However, these components are not essential components. The information processing apparatus may be a single-function printer which does not include the image reading section 150; a printer controller or a raster image processor (RIP) controller, each of which does not include the image reading section 150 and/or the image forming section 170; or a facsimile apparatus provided with a communication function with a telephone circuit.

FIG. 2 is a perspective view illustrating an outer configuration of the image forming apparatus of the present example. The image forming apparatus generally includes the image reading section 150 on an upper surface thereof and the operation and display section 180 on a front surface thereof. The image forming apparatus further includes a power supply operation section 200 composed of the power switch 130, the human body sensor 120, and if necessary, the notification section 190, on a side surface thereof. In FIG. 2, the power supply operation section 200 is disposed on the side surface of the image forming apparatus, but the position of the power supply operation section 200 is not limited to the configuration of FIG. 2. The power supply operation section 200 may be placed at an arbitral position as far as a user can operate the power supply operation section 200.

FIG. 3 illustrates a configuration example of the power supply operation section 200. The power switch 130 is arranged on an outer surface of the case of the image forming apparatus so as to allow a user of the apparatus to freely perform a power source on/off action. The human body sensor 120 is installed to be embedded on the outer surface of the case in the vicinity of the power switch 130 (here, an area above the power switch 130). The human body sensor 120 is configured to detect a human body approaching the power switch 130, and output a detection signal to the main controller 100. The notification section 190 is installed on the outer surface of the case in the vicinity of the power switch 130. The notification section 190 is configured to, when the main controller 100 recognizes the power-off action for the power switch 130 based on the detection signal outputted by the human body sensor 120, send a user a notification that a user's action suggesting that the user will turn the power switch off is now being performed, by light and/or sound, according to the command of the main controller 100, to call a user's attention about the power being turned off.

In FIG. 3, the human body sensor 120 is installed on the outer surface of the case and on an area above the power switch 130. However, the arrangement of the human body sensor 120 is not limited to that, and may be arbitrary as far as the human body sensor 120 is arranged at a position where the sensor can detect a human body approaching the power switch 130. That is, the human body sensor 120 may be installed at a position which is slightly separated from the power switch 130, or may be installed directly on the power switch 130. A detection range of the human body sensor 120 is not particularly limited. However, the detection range can be set to a range which can make a enough period of time to allow the main controller 100 to send a user the notification and write the data into the flash memory 110 from the time when the main controller 100 recognizes the power-off action performed for the power switch 130 to the time when the power source is actually turned off. For example, the detection range can be set to an arbitrary range of from several centimeters to tens of centimeters.

In FIG. 3, the notification section 190 is installed on the outer surface of the case of the apparatus and on an area above the power switch 130. However, the location of the notification section 190 may be an arbitrary position as far as the location allows a user to see flashing or lighting light or hear alert sound. For example, the notification section 190 may be arranged at a position which is separated from the power switch 130 or a main body of the image forming apparatus, or may be installed directly on the power switch 130.

As described above, by providing the human body sensor 120 arranged in the vicinity of the power switch 130 and the main controller 100 configured to recognize an action of a user likely to turn the power off based on a detection signal of the human body sensor 120, the main controller 100 can reliably write the data stored in the cache area prepared inside the RAM 101 into the flash memory 110, which avoids in advance a danger of losing necessary data. Further, by limiting the detection range of the human body sensor 120 to a space in the vicinity of the power switch 130, the main controller 100 does not write the data into the flash memory 110 even when a user who is present close to the image forming apparatus moves with another purpose other than turning off the power source. For this reason, compared with the conventional art, it is possible to reduce the number of times of writing data, and to restrict the deterioration of the life expectancy of the flash memory 110.

Further, by providing the notification section 190 arranged in the vicinity of the power switch 130 and configured to send a user a notification that an action of a user likely to turn the power off is now being performed and to give a warning to the user, such the configuration can prevent in advance a misoperation such that a user operates the power switch 130 by mistake. In addition, when the main controller 100 conducts a control to write data into the flash memory 110 if the condition that the action of the user likely to turn the power switch off continues still after the above notification has been sent (which means that, the main controller 100 does not write the data into the flash memory 110 if the user who received the notification left away from the power source switch 130), such a control can restrict unnecessary data writing into the flash memory 110. Thereby, compared to the conventional art, it is also possible to reduce the number of times of writing data, and to restrict the deterioration of the life expectancy of the flash memory 110.

The arrangement of the above-described notification section 190 can restrict a user's misoperation for the power switch 130, but if the power switch is arranged on the top surface or the front surface of the image forming apparatus and a user put her or his hand on the image forming apparatus or leans against the image forming apparatus, the power switch 130 can be turned off because of such action regardless of user's intention. In view of that, the power switch may be arranged in a concave part of the case of the image forming apparatus.

FIGS. 4A and 4B illustrate another example of an arrangement of the power supply operation section 200. In the image forming apparatus, the outer surface of the case is recessed to form a concave part, and the power switch 130 is arranged in the concave part so as not to protrude from the outer surface of the case. Accordingly, without losing operability of turning on/off the power source, it is possible to prevent in advance a user's misoperation about the power switch 130.

Also in this configuration, the location where the human body sensor 120 is arranged is not particularly limited. As illustrated in FIG. 4B, the human body sensor 120 may be installed on an edge of an opening portion of the concave part, may be installed on a bottom portion of the concave part, or may be installed directly on the power switch 130. Particularly, by arranging the human body sensor 120 at the edge of the opening portion of the concave part of the case so that the human body sensor 120 can detect a human body (particularly, a finger) entering into an inner space of the concave part, a user's action likely to turn the power switch off can be appropriately recognized. Further, also the location where the notification section 190 is arranged is not particularly limited. As illustrated in FIGS. 4A and 4B, the notification section 190 may be arranged on the outer surface of the case and in the vicinity of the concave part of the case, or on the bottom surface of the concave part. Particularly, by arranging the notification section 190 on the outer surface of the case and in the vicinity of the concave part of the case, the notification section 190 can appropriately send a user a notification that an action of a user likely to turn the power off is now being performed.

As another method of writing data into the flash memory 110 before the power source is actually turned off, it can be considered, for example, a method to incorporating a control circuit inside the power switch 130 or the power source device 140, where the control circuit conducts a control to turn the power off after the main controller writes data into the flash memory 110. In this method, it is not possible to prevent in advance the misoperation by the user. In contrast, the present example provides a construction to send a user a notification that an action of a user likely to turn the power switch off is being operated, and further provides the power switch 130 arranged in a concave part of the case of the information forming apparatus. Such a construction can prevent in advance the misoperation by the user. Therefore, the construction and the method of the present example can be considered more excellent than the method of incorporating the above-described control circuit.

Next, operations of the image forming apparatus of the present example will be described with reference to FIG. 5 and FIG. 6. FIG. 5 is a flowchart illustrating operations of the image forming apparatus. FIG. 6 is a view illustrating the transition relations of working modes of the image foaming apparatus.

Under condition that the image forming apparatus is in a power off state (M100 in FIG. 6), when a user turns on the power switch 130 in the power supply operation section 200 to supply power to the image forming apparatus (S100), the main controller 100 performs an apparatus-startup processing (S101). When the apparatus-startup processing is completed, the main controller 100 controls the operation and display section 180 to display a user interface screen thereon so as to allow a user to operate the image forming apparatus. At that time, the image forming apparatus changes into a waiting mode (M103 in FIG. 6) (refer to S201 in FIG. 6).

After that, in response to a user's operation performed on the operation and display section 180, the main controller 100 controls the image reading section 150, the image processing section 160, or the image forming section 170 to perform a copy function, a scan function, or a document-data print function, and starts operations of the image forming apparatus (S102). At that time, the image forming apparatus changes into an operating mode (M104 in FIG. 6) (refer to S202 in FIG. 6).

After performing the copy function, the scan function, or the print function, the image forming apparatus changes into the waiting mode (M103) again (refer to S203 in FIG. 6). In the case that the image forming apparatus continues to work in the waiting mode (M103) for a certain period of time, the image forming apparatus changes into a power-saving mode (M102 in FIG. 6) in which power consumption of the apparatus is lower than that in the waiting mode (refer to S204 in FIG. 6), and continues to work in the power-saving mode until a user's operation is detected. When receiving a user's operation in the power-saving mode, the image forming apparatus changes into the waiting mode (M103) again (refer to S205 in FIG. 6).

In each of the operating mode (M104), the waiting mode (M103), and the power-saving mode (M102), the human body sensor 120 monitors a change in state of a space around the power switch 130. The main controller 100 obtains a detection signal outputted from the human body sensor 120 (S103). Based on the detection signal, the main controller 100 determines whether an action of a user likely to turn the power switch 130 off (a power-off action) is performed or not (S104), and conducts the processes of S102 and S103 repeatedly until the power-off action is recognized.

In S104, on recognizing a user's power-off actin for the power switch 130, the main controller 100 controls the notification section 190 to send a user a notification that the power-off action is now being performed, by using light or sound (S105), and then performs a pre-shutdown sequence including a process of writing the data stored in the cache area prepared inside the RAM 101 into the flash memory 110 (S106).

Directly after sending a user the notification that the power-off action is being performed, the main controller 100 may perform the pre-shutdown sequence. However, there is a case where a user who received the notification stops the power-off action. For this reason, the main controller 100 may perform the pre-shutdown sequence in response to detecting a human body approaching the apparatus for a predetermined period of time still after sending the above-described notification. Thereby, it is possible to reduce the number of times of writing data into the flash memory 110, and to control the deterioration of the life expectancy of the flash memory 110.

In the above-described pre-shutdown sequence, the data to be written into the flash memory 110 may not be all the data in the cache area. For example, the main controller 100 may conduct a control to compare data in the flash memory 110 with data in the cache area, chose only inconsistent data between the two pieces of data (such as data stored in the cache area but having not been written into the flash memory 110, and data updated after being written into the flash memory 110), and write the chosen data into the flash memory 110.

After completing the pre-shutdown sequence, the image forming apparatus changes into a pre-shutdown mode (M101 in FIG. 6) (refer to S206 in FIG. 6). The pre-shutdown mode (M101) is a mode in which the main controller 100 does not perform access to the flash memory 110 at all. The processing of changing the image forming apparatus into the pre-shutdown mode (M101), can prevent damage of the data written into the flash memory 110 and the flash memory 110 itself even if, after the change into the pre-shutdown mode, the power switch 130 has actually been turned off, the image forming apparatus has changed into the power-off state (refer to S207 in FIG. 6) and then the power supply was suddenly stopped.

In the case that the power switch 130 has not actually been turned off in the pre-shutdown mode (M101), the main controller 100 monitors a user's operation based on an output signal outputted from the operation and display section 180 (S107). If a user's operation is not detected, the main controller 100 determines whether a predetermined time has been elapsed after the image forming apparatus changed into the pre-shutdown mode (M101) (S108). If a user's operation has been detected or if the predetermined time has been elapsed without detecting a user's operation, the main controller 100 performs a resume sequence to return from the pre-shutdown mode (S109), and the image forming apparatus returns from the pre-shutdown mode (M101) to another working modes (refer to S208 in FIG. 6).

The resume sequence from the pre-shutdown mode includes a process of changing the image forming apparatus from the pre-shutdown mode (M101) into the operating mode (M104), for example, if a user has performed an operation to conduct a copy function, a scan function or a print function in S107. The resume sequence from the pre-shutdown mode further includes a process of, if a user's operation is not detected for a predetermined time in S108, changing the image forming apparatus into a previous working mode (one of the operating mode (M104), the waiting mode (M103) and the power-saving mode (M102)) in which the information processing apparatus worked just before being changed into the pre-shutdown sequence in S106.

As described above, there is provided an image forming apparatus which can work in the pre-shutdown mode (M101) in addition to the typical working modes (the operating mode (M104), the waiting mode (M103), and the power-saving mode (M102)). After a completion of the pre-shutdown sequence to write data stored in the cache area in RAM 101 into the flash memory 110, the image forming apparatus changes into the pre-shutdown mode (M101). In the pre-shutdown mode (M101), the flash memory 110 is not accessed. Thereby, even in the case that the power switch 130 is actually turned off after the apparatus has changed into the pre-shutdown mode and the power supply has been suddenly stopped, it is possible to prevent the damage to the device, such as an instantaneous interruption of electric power, and damage to the data stored in the device.

In another case that no operation performed by a user is detected for a predetermined period of time after the image forming apparatus has changed into the pre-shutdown mode (M101), the image forming apparatus is controlled to return into the previous working mode in which the image forming apparatus worked just before being changed into the pre-shutdown mode (M101). Thereby, it is possible to improve convenience of the user. For example, in the case that the human body sensor 120 detected approach of a human body under the condition that the image forming apparatus was working in the operating mode (M104) or the waiting mode (M103), the image forming apparatus returns from the pre-shutdown mode (M101) into the correspond one of the operating mode (M104) and the waiting mode (M103), which allows the image forming apparatus to immediately initiate its processing. In another case that the human body sensor 120 detected approach of a human body under the condition that the image forming apparatus was working in the power-saving mode (M102), the image forming apparatus returns from the pre-shutdown mode (M101) into the power-saving mode (M102) rather than the operating mode (M104) and the waiting mode (M103), which prevents unnecessary power consumption.

The invention is not limited to the above-described embodiments and examples, and it is possible to appropriately change the configuration and the control method of the information processing apparatus without departing from the scope of the present invention.

For example, in the above-described embodiment, the image forming apparatus is described as an example of the information processing apparatus, but the information processing apparatus is not limited to the image forming apparatus. The power-off control as an embodiment of the invention can be applied to any apparatus in which data stored in a cache area is written into a nonvolatile memory on turning the power off.

The invention claimed is:
1. An information processing apparatus comprising:
 a nonvolatile memory;
 a cache memory for caching data to be written into the nonvolatile memory;

a power switch for stopping supplying power to the information processing apparatus;
a spatial change detecting section configured to detect a change in state of a space around the power switch;
a notification section configured to send the user a notification; and
a control section configured to
  determine an action of a user likely to turn the power switch off, based on a detection signal outputted by the spatial change detecting section, and
  in response to recognizing the action under a condition that the power switch is on, 1) start writing data stored in the cache memory into the nonvolatile memory while power is supplied to the information processing apparatus under the condition that the power switch is on and 2) operate the notification section to send the user a notification that the action is being performed, wherein
the spatial change detecting section is arranged in a vicinity of the power switch, and
the control section is configured to determine that the action has been performed, in response to the spatial change detecting section detecting a human body approaching the power switch.

2. The information processing apparatus of claim 1,
wherein the control section is configured to start writing the data stored in the cache memory into the nonvolatile memory, on recognizing that the action continues for a predetermined period of time after operating the notification section to send the user the notification.

3. The information processing apparatus of claim 1,
wherein the control section is configured to, on writing the data into the nonvolatile memory,
  compare the data stored in the cache memory and data having already been written into the nonvolatile memory, and
  write only data stored in the cache memory and having not been written into the nonvolatile memory, into the nonvolatile memory.

4. The information processing apparatus of claim 1,
wherein the control section is configured to change a current working mode of the information processing apparatus to a specific working mode in which the volatile memory is not accessed, after writing the data into the volatile memory.

5. The information processing apparatus of claim 4,
wherein the information processing apparatus can work in a plurality of working modes in addition to the specific working mode, and
the control section is configured to, on receiving no action performed by a user for a predetermined period of time after changing the current working mode of the information processing apparatus to the specific working mode, return the information processing apparatus to a previous working mode in which the information processing apparatus worked just before being changed into the specific working mode, the previous working mode being one of the plurality of working modes.

6. The information processing apparatus of claim 1,
wherein the power switch is arranged in a concave part of a case of the information processing apparatus, and
the control section is configured to determine that the action has been performed, in response to the spatial change detecting section detecting a human body entering into a space inside the concave part.

7. A power-off control method of an information processing apparatus including a nonvolatile memory, a cache memory for caching data to be written into the nonvolatile memory, a power switch for stopping supplying power to the information processing apparatus, a spatial change detecting section configured to detect a change in state of a space around the power switch,
the power-off control method comprising:
  determining an action of a user likely to turn the power switch off, based on a detection signal outputted by the spatial change detecting section; and
  in response to recognizing the action under a condition that the power switch is on,
  starting writing data stored in the cache memory into the nonvolatile memory while power is supplied to the information processing apparatus under the condition that the power switch is on, wherein
the spatial change detecting section is arranged in a vicinity of the power switch,
the determining the action, includes determining that the action has been performed, in response to the spatial change detecting section detecting a human body approaching the power switch,
the information processing apparatus further includes a notification section configured to send the user a notification, and
the power-off control method further comprises: in response to recognizing the action, operating the notification section to send the user a notification that the action is being performed.

8. The power-off control method of claim 7,
wherein the starting writing data stored in the cache memory into the nonvolatile memory, includes starting writing the data stored in the cache memory into the nonvolatile memory, on recognizing that the action continues for a predetermined period of time after the operating the notification section to send the user the notification.

9. The power-off control method of claim 8, further comprising:
comparing the data stored in the cache memory and data having already been written into the nonvolatile memory, and
writing only data stored in the cache memory and having not been written into the nonvolatile memory, into the nonvolatile memory.

10. The power-off control method of claim 8, further comprising
changing a current working mode of the information processing apparatus to a specific working mode in which the volatile memory is not accessed, after the writing the data into the volatile memory.

11. The power-off control method of claim 10,
wherein the information processing apparatus can work in a plurality of working modes in addition to the specific working mode, and
the power-off control method further comprising, on receiving no action performed by a user for a predetermined period of time after the changing the current working mode of the information processing apparatus to the specific working mode, returning the information processing apparatus to a previous working mode in which the information processing apparatus worked just before being changed into the specific working mode, the previous working mode being one of the plurality of working modes.

12. The power-off control method of claim 7,
wherein the power switch is arranged in a concave part of a case of the information processing apparatus, and the determining the action, includes determining that the action has been performed, in response to the spatial change detecting section detecting a human body entering into a space inside the concave part.

13. An image forming apparatus comprising:
the information processing apparatus of claim 1, including an image forming section configured to perform print processing on a sheet of paper.

14. The image forming apparatus of claim 13,
wherein the cache memory stores at least one of a total number of print sheets and a toner consumption amount.

* * * * *